United States Patent [19]

Lapeyre

[11] Patent Number: 5,062,070
[45] Date of Patent: Oct. 29, 1991

[54] COMPREHENSIVE COMPUTER DATA AND CONTROL ENTRIES FROM VERY FEW KEYS OPERABLE IN A FAST TOUCH TYPING MODE

[75] Inventor: James M. Lapeyre, New Orleans, La.

[73] Assignee: The Laitram Corporation, New Orleans, La.

[21] Appl. No.: 597,034

[22] Filed: Sep. 20, 1990

Related U.S. Application Data

[63] Continuation of Ser. No. 395,216, Aug. 17, 1989, abandoned, which is a continuation-in-part of Ser. No. 729,559, May 2, 1985, Pat. No. 4,910,697, which is a continuation-in-part of Ser. No. 787,633, Oct. 15, 1985.

[51] Int. Cl.$^5$ ............................................. G06F 3/023
[52] U.S. Cl. ........................... 364/709.16; 364/709.15
[58] Field of Search ....................... 364/709.16, 709.15

[56] References Cited

U.S. PATENT DOCUMENTS

| | | | |
|---|---|---|---|
| 3,675,513 | 7/1972 | Flanagan et al. | 364/709.16 |
| 3,892,958 | 7/1975 | Tung | 364/709.15 |
| 3,967,273 | 6/1976 | Knowlton | 341/22 |

OTHER PUBLICATIONS

C. K. Clauer; IBM Tech. Dis. Bulletin, vol. 21, No. 10, Mar. 1979.

*Primary Examiner*—David H. Malzahn
*Attorney, Agent, or Firm*—Laurence R. Brown; James T. Cronvich

[57] ABSTRACT

A data processing keyboard system is provided wherein data and command signals from the keyboard are entered by two or more successive keystrokes. At least two operation modes serve to change the entry command assignments to the keys, thereby affording a large number of selections from a few keys. This makes available from the comprehensive capability of present day computers large numbers of keyboard accessible commands. Also surprisingly then this invention can replace a normal QWERTY typewriter keyboard with most of its functions by a set of only three, four, seven or nine keys. Thereby alphabetic characters, decimal digits and a store of computer command entries may be processed with each entry requiring two or more strokes of the computer keyboard keys. Functional commands such as spacing return or shift can be intermixed with the choice of data characters. Means for shifting from a computation mode to an alpha mode of computer operation may be provided. Keyboard selected modes change the key assignments. Thus an alpha mode for a computer may assign the entire alphabet first stroke to a set of three home keys arranged in a geometric configuration of no more than sixteen keys for touch typing control by fingers on one hand. The key assignments are made wherein the easier to access strokes are allocated to the more frequently encountered letters of the alphabet. Provisions are made for allocating some of the keys to custom tailored command signals entered from the keyboard.

1 Claim, 5 Drawing Sheets

COMPREHENSIVE COMPUTER DATA AND CONTROL ENTRIES FROM VERY FEW KEYS OPERABLE IN A FAST TOUCH TYPING MODE

This application is a continuation of my application Ser. No. 07/395,216 filed Aug. 17, 1989, now abandoned, which in turn is a continuation-in-part of the co-pending application Ser. No. 06/729,559 filed May 2, 1985 for Programmable Computer With Alphanumeric Capabilities Having Few Keyboard Keys, now U.S. Pat. No. 4,910,697, Mar. 20, 1990 and is a continuation-in-part of co-pending application Ser. No. 06/787,633 filed Oct. 15, 1985 for Computer Keyboard System With Few Keys Displaying Hundreds of Functions, and incorporates those applications herein in entirety by reference.

TECHNICAL FIELD

This invention relates to entry of many data and control function commands into computerized data processing systems from very few keys on a keyboard, and more particularly it relates to computer-keyboard systems operable to make manual data and command input entries in response to two or more successive key strokes.

BACKGROUND ART

In the rapid development of the computer arts, the capacities of the computer to handle data has greatly increased. However the manual input of data through keyboards has continued to be a significant limitation to the high speed data processing capabilities available. Also there are so many possible functions performed by modern computers, that there is a limitation on the use of many of them in the keyboard manual input restrictions of the prior art. Even pocket sized portable computers have hundreds of data and command functions otherwise accessible to keyboard operation unavailable because of keyboard limitations.

The trend to computer keyboard operation is evidenced by the U.S. Pat. No. 3,892,958 to C. Tung, July 1, 1975, which requires 36 keyboard keys to access at most about 100 computer functions, thereby using only a small part of those that could be made available. This keyboard uses two of the 36 keys for changing the key assignments from a default mode to two other modes thereby tripling the number of accessible data input characters and operating commands otherwise available from the 36 keys. Each key thus produces from a single keystroke a different function in each of the modes. Thus to increase the number of functions above about 100 in this conventional prior art manner, either the number of keys must be increased or the number of key assignment modes must be increased.

It is extremely difficult to enter any substantial variety of information into the computer, with such keyboards, including the provision of alphabetic characters, which with 26 entires required necessitates separate modes for numeric digits or computer command signals and alpha characters from the 36 key keyboard. Furthermore, if this computer is used in the programming mode for example, very complex keystroke sequences are involved, such as changing from mode to mode by use of the mode change keys many times in the entry of a program step. This of itself is not conducive to fast entry touch typing. Furthermore the key layout is not capable of easy entry by touch typing, and is primarily only useful for slow hunt and peck methods.

In other conventional computer input keyboards such as for personal computers, QWERTY typewriter keyboards are supplemented with further sets of keys, typically about 40. It is impossible to efficiently use such keyboards for rapid touch typing input because of the necessity to reach to many inconvenient positions for command signals. Also it is conventional for each command signal to use one key, so that most of the available capacity of the computer to access functions and subroutines simply is sacrificed in favor of complex routines using many keystrokes and much waiting time.

It is therefore a primary object of this invention to produce rapid manual entry of input data and commands into a data processing computer system from a keyboard, capable of rapid touch typing and having the capability to process a greater proportion of the accessible computer functions with simple keystrokes.

Further similar computer prior art converting a keyboard to operate differently in different modes includes U.S. Pat. Nos. 3,956,745 issued to A. Ellis May 11, 1976 and 3,600,592 issued to R. Mahon, et al. on Aug. 17, 1971. An overlay need be changed manually when each mode is selected to provide appropriate markings on the keys. These systems would require, for example on a twelve key keyboard, twelve different mode changes and twelve different keyboard overlays to produce 144 different key choices, and are incapable of providing a large number of key choices per key without changing operating modes.

It is rather an objective of this invention to provide many choices per key, and yet to find a way to provide keyboard markings that identify the many choices without requiring overlay changes or other operations that reduce the input speed of keyboard entries.

It is known in the art to reduce the number of keyboard keys required for a given number of entries, by making entries of individual data characters or control commands in response to two successive keystrokes. Thus, a set of keys may produce more than one input entry per key. If n keys are available, n times n entries may by provided by two stroke per character operation, n times n times n entries may be provided by three stroke per character operation, etc.

Thus in British Patent No. 1,417,849, Dec. 17, 1975 with two strokes per character, operation of a typewriter is permitted by means of only seven keys. U.S. Pat. No. 3,833,765 issued to E. Hillborn et al. Sept. 3, 1974 provides for both alphabet characters and more complex messages to be chosen by the two letter codes provided by the two successive keystrokes from a set of twelve keys arranged for four finger touch typing with one hand. U.S. Pat. No. 3,967,273 issued to K. Knowlton on June 29, 1976 provides for the two keystroke per character entry operation from a telephone keyboard to permit both alphabetic and numeric digits to be generated from twelve keys.

It is one feature of the invention that this type of two (or more) strokes per character keyboard in data processing systems will reduce the number of keys required and significantly increase the number of computer functions accessible by the keyboard. Thus, with only twelve keys, more selections may be made in a two stroke per character mode than with the 36 keys of the aforementioned Tung keyboard.

However this art is most limited in the ability to mark the keyboards for visual key selections of the many functions available. Knowlton, above referenced, for example, reduces his number of entries available from 144 to 81, in order to provide a feasible way to mark the keys.

It is an object of the invention to improve such keyboards to provide even greater numbers of choices of entries from a set of keys which visually portray the available key choices. The prior art relating to the two stroke per entry type of keyboard, as evidenced by the above cited art, has not advanced the state of the art so that more than 144 selections may be made from as few as twelve keys. Neither has it provided a feasible way of showing that key operable functions could be made available for very large numbers of computer command selections, or that an alphabetic system similar to standard typewriter keyboards could be provided with as few as three or four keys.

One important objective of the invention is to provide a computer-keyboard system which reduces both the number of input strokes and the typing time and convenience from that of the Tung type keyboard to enter data and commands into a programmable computer and does this from fewer keys from which more input selections may be entered.

No known computer-keyboard art has been provided that is convenient and fast for manual manipulation in the touch typing mode for both data and command input entries, or for large numbers of entries with few keys. Thus, it is a particular system objective to provide a touch typing keyboard input capability with a few keys efficiently operable by the fingers of a single hand for entry of a large number of both data and command signals to a computerized data processing system.

Also it is an object of this invention to provide improved keyboards having few keys and operable in fast typing modes from touch typing from the fingers of one hand for replacing conventional typewriter keyboards.

DISCLOSURE OF THE INVENTION

The invention is embodied in a computer-keyboard system having as few as three or four keys operable by the fingers of a single hand in a touch typing mode at efficient data and command entry speeds for entry of many input signals to make comprehensive use of the large number of commands available from present day computerized data processing systems or to replace conventional typewriter keyboards.

The large number of entries from a few keys is made available by operation of the keys in a variety of selection modes. Thus with a set of only four keys, alphanumeric data and functional commands with 45 unique input signal selections may be provided for simple and rapid selection of each entry in one of the preferred embodiments of this invention. By requiring two keystrokes for each entry, four keys provides sixteen possible unique entries. By providing for two of the entries to select two additional key assignment modes, the number of unique entries are essentially tripled. Thus all the alphabet characters and decimal digits are accessible together with several extra selections for punctuation, control or command functions. In this keyboard by the assignment of alphabetic characters more frequently encountered to the easiest to stroke key combinations, more than eighty percent of the alpha text may be entered by two strokes per character without requiring a mode change. In another embodiment of the invention, with only three keys and an operating mode requiring three successive keystrokes per character entry, the entire typewriter keyboard is replaceable by three keys, so that the fingers never have to be removed from home key positions. One important feature of the invention is the key assignments that permit typing to be easier and faster, wherein the first stroke does not require a reach, and the successive strokes are the easiest ones available for those more frequently encountered input functions or characters.

This keyboard concept is applicable for six, seven, twelve or sixteen key keyboards providing for large numbers of input entry choices, from touch typing with fingers on a single hand, thereby providing for computer input keyboards fast input and comprehensive capability with few keys.

The keys may carry visual instructions for the keystroke sequence for each entry, thereby overcoming the deficiency of adequate operating instruction displays in the prior art. In this respect, the selected key for the first keystroke carries its multiple entry indicia for the various choices available from that key and further identifies the subsequent stroke or strokes necessary for each of the choices.

Of particular importance in this invention is the key-character layout, which significantly affects typing speed. Thus, for example in one preferred embodiment, all the alphabet characters are selectable from three home keys to be operated by the three middle fingers of one hand for a first stroke. Thus, where more than three keys are employed, no more than one reach to an adjacent key is required for any alphabetic character. Further, the more frequently used letters are assigned the easiest fingerstroke positions, thereby further optimizing the typing speed so that even with two strokes required per entry typing input speeds comparable to high speed typing on standard QWERTY keyboards is feasible. In this manner many more selections than the alphabet are obtained from very few keys, providing for control of both computer input data and command entries by the touch typing mode for the first time.

As distinguished from the key assignment modes, also several computer operating modes such as alpha, user, program, data entry and command entry modes may be selected by command entries available from the keyboard. Another feature of this invention permits the keystroke and data-command entries to be selected or varied to suit the convenience of a particular user in a special key allocation mode where keyboard command entries can program the stroke assignments of the respective keys and their corresponding data, subroutine or command entries to suit particular needs.

When the keyboard data and command entries are made in response to a sequence of two successive keystrokes, thereby as many as n times n entries are available from n keyboard keys. Thus seven keys provide 49 entries in each key allocation mode, twelve keys 144, etc. The keys are particularly arranged for efficient touch typing input, by allocation of the most frequently used alphabet characters to the easiest to stroke key pair locations. By providing for a plurality of key allocation modes, the number of key entry selections is further increased. Thus, in an alphabetic mode of operation the entire alphabet may be selected by a first keystroke from only three keys at a home key position with the remaining keystroke allocated to adjacent keys that are easy to reach. With three keystrokes per entry, all entries are made from the home keys. That means the time taken to move fingers, or reach, is eliminated from the touch typing process and significantly increases the typing speed.

BRIEF DESCRIPTION OF THE DRAWINGS

The invention may be better understood by reference to the accompanying drawings, in which:

FIG. 4 is a plan view of a keyboard array of sixteen keys from which a large number of data character and functional command entries may be made as set forth on the accompanying key assignment chart;

FIG. 6 is a plan view of a twelve key keyboard key array and key selection chart, which permits efficient and rapid touch typing entry of the entire alphabet with three fingers of a single hand;

THE PREFERRED EMBODIMENTS

Figure 1:
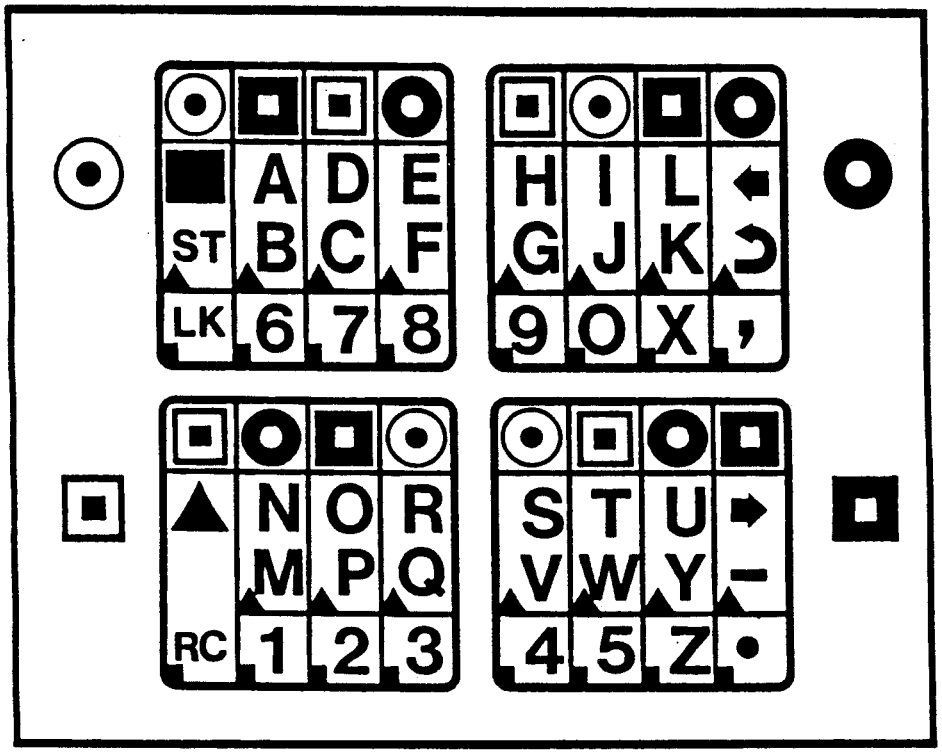
FIG. 1 is a plan view of a four key array providing forty-six unique signal entry choices, which are laid out to provide all 26 alphabetic characters, the ten decimal digits and various punctuation and control functions.

In accordance with this invention, an alphanumeric keyboard for entry of a full set of alphabetic characters, the ten decimal digits, and several punctuation and command signals is achieved in one embodiment with only four keys, represented by the rectangular outlines in FIG. 1. This type of keyboard is especially convenient where ever space limitations do not permit more keys. For example, a very small keyboard can be incorporated in a video camera for dubbing in dates, peoples names, etc.

In this example, the respective ones of the four keys are identified by the Arabic numerals 1 to 4 and accompanying geometric pattern. The keys could be in four colors, or otherwise named. Four keys are easily arranged in a two by two geometric configuration for taking up little space.

The key chart legend graphically shows all the twelve entry choices available in the three lowermost rows by the character or function identification. The second keystroke choice provides four possibilities for each key as charted in the top row showing respectively four columns identified by the geometric key identification symbols. In each column, there are three entry choices depending upon the key assignment modes, in this case identified by the triangle and square subscripts, where applicable. Thus the keys have three assignment modes, wherein the top rows (without subscripts) show by the column in which the desired entry choice resides, the second key to be stroked in the mutually exclusive two stroke sequence required as a minimum number of strokes to enter any character.

Some entries require four strokes. For selection of these entries a shift key, designated by either a triangle or square, is first actuated by a two stroke sequence. Thus a character, such as A, is simply entered by the stroke of the number one key showing the A and the stroke of the number four key identified by the heading symbol of the column in which the A is found.

Figure 2:
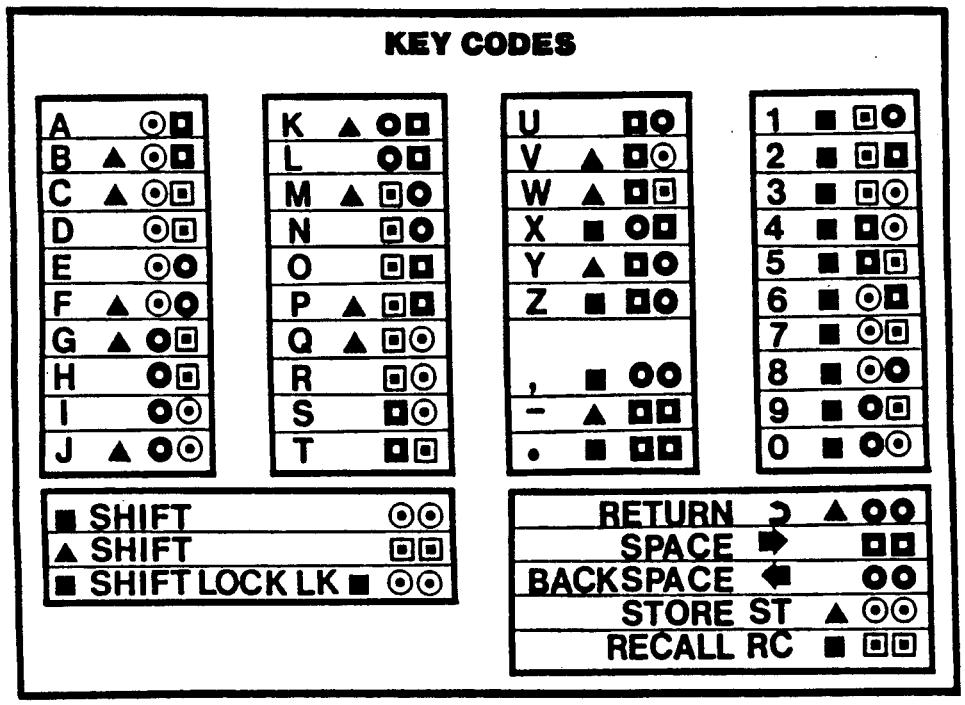
FIG. 2 is a chart showing the various signal selections available from the keys of FIG. 1 and the corresponding keystroke sequences.

If a character, such as Z, is identified with a square subscript, then the square shift key (one) is stroked twice preceding the two stroke Z entry. Similarly if the letter Q is marked with a triangle subscript, then the triangle shift key (three) is stroked twice before that character is entered. The chart of FIG. 2 is a truth table outlining the keyboard choices and the stroke sequence.

In that chart it is seen that such computer commands as store and recall are provided in addition to punctuation marks, the alphanumeric characters and functional commands such as carriage return, space, lock and backstroke. The signal entries are identified in one column as A,B,C, etc. The two adjacent columns to the right then identify the stroke sequence for entering the particular unique signal selection. Thus the intermediate column shows when the shift keys need be stroked. The right hand column then shows the two key stroke sequence. The display on the keys of FIG. 1 is thus duplicated in chart form in FIG. 2.

It is an important aspect of this invention that a data entry system be provided where the more frequently encountered characters are easier to enter. Thus, it is easily seen from the chart of FIG. 2 that the vowels, AEIOU, are selected with two keystrokes, and do not necessitate the preselected shift strokes as do the infrequently used characters J,Q,Z.

Figures 3, 5:
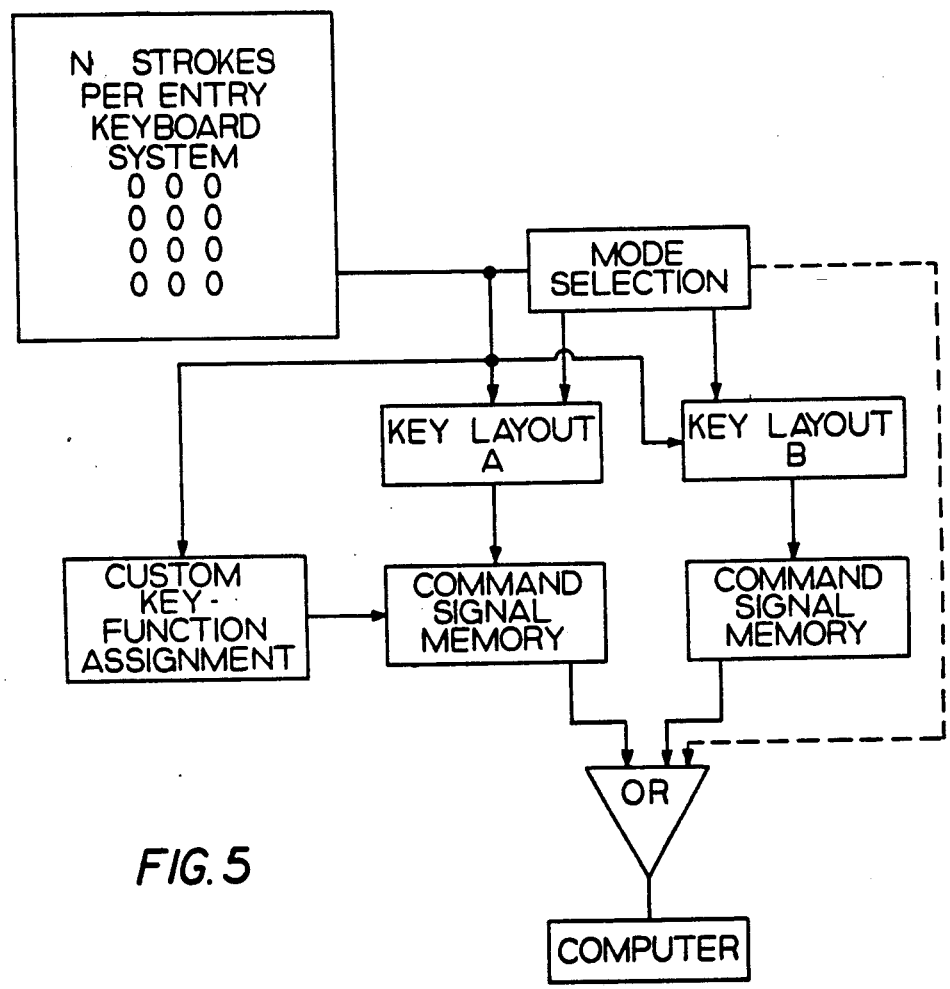
FIG. 3 is a plan view layout of a seven key keyboard array for producing up to forty-nine unique signal selections, as laid out for alphanumeric operation to replace the standard typewriter keyboard of over forty keys.
FIG. 5 is a block system diagram of a computer-keyboard system providing for custom tailoring of a keyboard to suit the needs of an individual user and to provide a large number of computer input data and command signals from very few keys, in this embodiment sixteen.

In FIG. 3, a similar keyboard arrangement is shown wherein seven keys are identified by decimal digits 0 to 7. In this embodiment with two strokes per character selection, 49 choices are available, so that the shift keys of FIG. 1 become unnecessary. The legend on the respective keys, laid out in a rectangular geometric configuration in this embodiment, thus is simply the available character or function description and a subscript. Thus the key displaying the desired character selection is first stroked, and then the key designated by the subscript. For the shift function, then an 0-0 sequence is stroked, etc. Note that the vowels A, E,I, most frequently encountered are entered with the simplest strokes 1-1, 2-2, 3-3. The control functions such as space and return are similar more frequently encountered selections. This array can be operated by four fingers on one hand, or three if the shift key is a reach key. Thus it is particularly adaptable to fast touch typing operation in the manner that will be more thoroughly discussed hereinafter. Faster typing is available here than in the four key version, because no more than two strokes are required for any selection.

Figure 4:
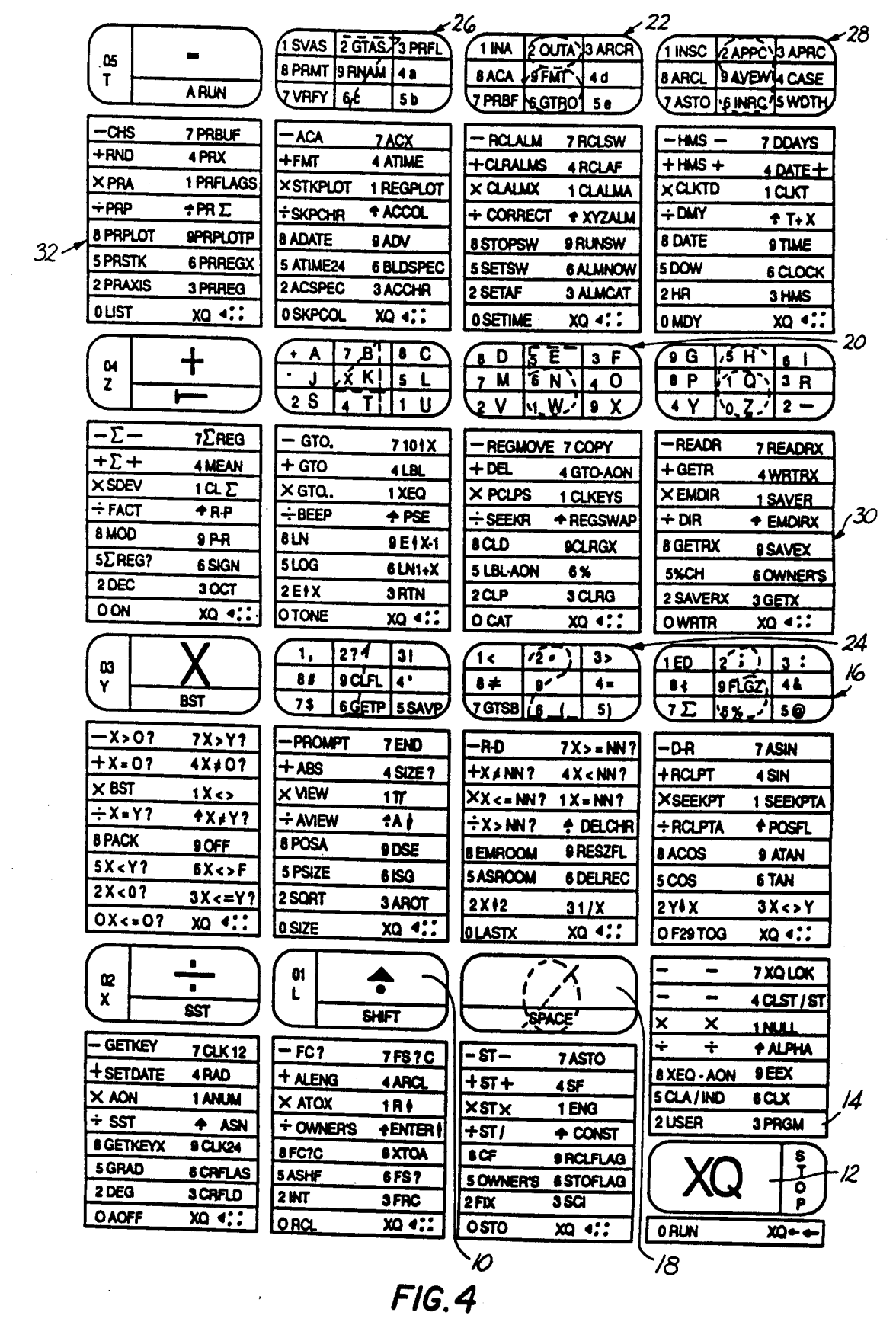

The parent applications, above referred to and incorporated herein by reference, similarly set forth computer systems which operate to input data characters and command signals from a keyboard in response to two successive mutually exclusive strokes of single ones of the keys with a few keys providing many input selections laid out adjacent the keyboard on an operating chart, such as that of FIG. 4.

This keyboard provides twelve basic keys, identified by keyboard legends 0-9, XQ, a decimal and entry arrow, plus four optional arithmetic functions (−, +, X, ·), which may select the basic arithmetic functions by a single keystroke. The keyboard chart associates each key location with a first keystroke of a required two stroke sequence to make a data or command entry. Thus, to enter a beep, the 4 key is first stroked and then the . key as outlined in the chart under the 4 key, for example.

The associated computer is able to execute the various commands outlined in the keyboard chart by means of accessible command signals or stored program subroutines, and has keystroke decoding means for selecting the desired data or command inputs from the designated keystrokes. This particular keyboard provides for a special entry key 10, which uses the decimal point signal on its second occurence in a numerical word as an input entry signal, thus saving an extra key for this purpose.

The XQ key 12 is a control or mode shift key usable for example to activate the arithmetic functions. Thus note on chart 14, that the XQ,. keystroke sequence will actuate the divide arithmetic function. Some selected functions are toggled, such as for example the program command function 14, which is turned on and off by election of the two stroke entry XQ,3. This keystroke sequence sets up a program operating mode. The keystroke sequence XQ,arrow (decimal point key) will set up an alpha mode.

In this alpha mode, note that the roles of the keys on the keyboard are changed. The charts 16, 20, 24, etc., positioned on the keys now define the new roles of the keys in this different operating mode. Note that the entire alphabet is selected by a first keystroke from key row 4,5,6, which is a home key row for one hand touch typing. A set of nine keys can give 9×9 or 81 selections in the alpha mode, and a representative set of available characters and commands are set forth on the chart. Decimal digits may also be allocated to make this an alphanumeric mode, or if preferred, the numerical keys may be used in one operating mode, usually the default mode, to enter numerical digits with one keystroke only from a live keyboard.

Also of particular interest is the provision of custom tailored owner's modes, one of which 30 is selected by the 6,6 keystroke sequence. Any particular user thus may custom tailor the keyboard to their own use for particular functions in their line of endeavor. For this purpose special memory sections are switchable from this keyboard input to change the role of the keys to that desired in an owner's mode, or several owner's modes as seen from the presence of additional owner's selections 0,5 and arrow,+.

Another feature of this invention is noted by the assignment 32 of an entire bank of 64 functions at the choice of the owner through keyboard assignment of the key functions to be available from that bank of keys both in or out of the user's mode.

The computer-keyboard system functional block diagram organization for instituting the various features heretofore described is shown in FIG. 5. The two stroke per input keyboard assembly 35 is shown with keyboard inlet signal line 37 leading to the computer 39 by way of a key function assignment mode control system. Thus, mode selector 41 may be actuated from the keyboard 35 to select one of various keyboard operating modes. Representative are two selections providing for key layouts A and B, (43, 45) with dotted line 47 indicating that further similar selections could be made. Thus, the two keystrokes for each entry may be decoded and assigned to whatever functions are stored in the command signal memories 49 and 51 associated with the respective keyboard operating modes.

Of particular note is the ability to write into the key command memory 49 any desired set of key functions, by way of the custom key function assignment section 53. The memory 51 may be a read only memory (ROM) and it can be custom tailored to the user's needs and selected in the user's mode. As many mode selections as desired may be incorporated as shown by line 47.

Computer input is keyboard limited, since manual to machine conversion is made by way of the keyboard. Thus it is a critical problem in a computer-keyboard system to provide for as fast a manual keyboard input speed as feasible. Also it is critical in many operations to have one hand free for other purposes, so that a single hand operable keyboard is desirable. Prior art keyboard input systems for alphabetic input has overwhelmingly been the conventional two hand QWERT type. It is however known in the art to improve the ease of manual alphabetic information input by using frequency of use tables for different alpha characters and assigning the most frequently used characters to the easiest to use key combinations. British Patent Specification No. 511,240 accepted Aug. 15, 1939 thus shows the selection of key chord combinations of one or more keys simultaneously actuated to introduce different more frequently used alphabet letters with relatively easy to finger chord combinations. Thus for a stenotype machine requiring two hands, the keys are grouped in a coded manner that permits chord selections by up to four fingers on either hand plus the two thumbs in the easiest and therefore the fastest manner for the most frequently encountered alpha characters. This principal is now extended by this invention to an entirely different kind of key entry system, namely a one handed touch typing system using only three fingers on one hand for selection, wherein each entry requires two successive strokes of a single key.

Figure 6:
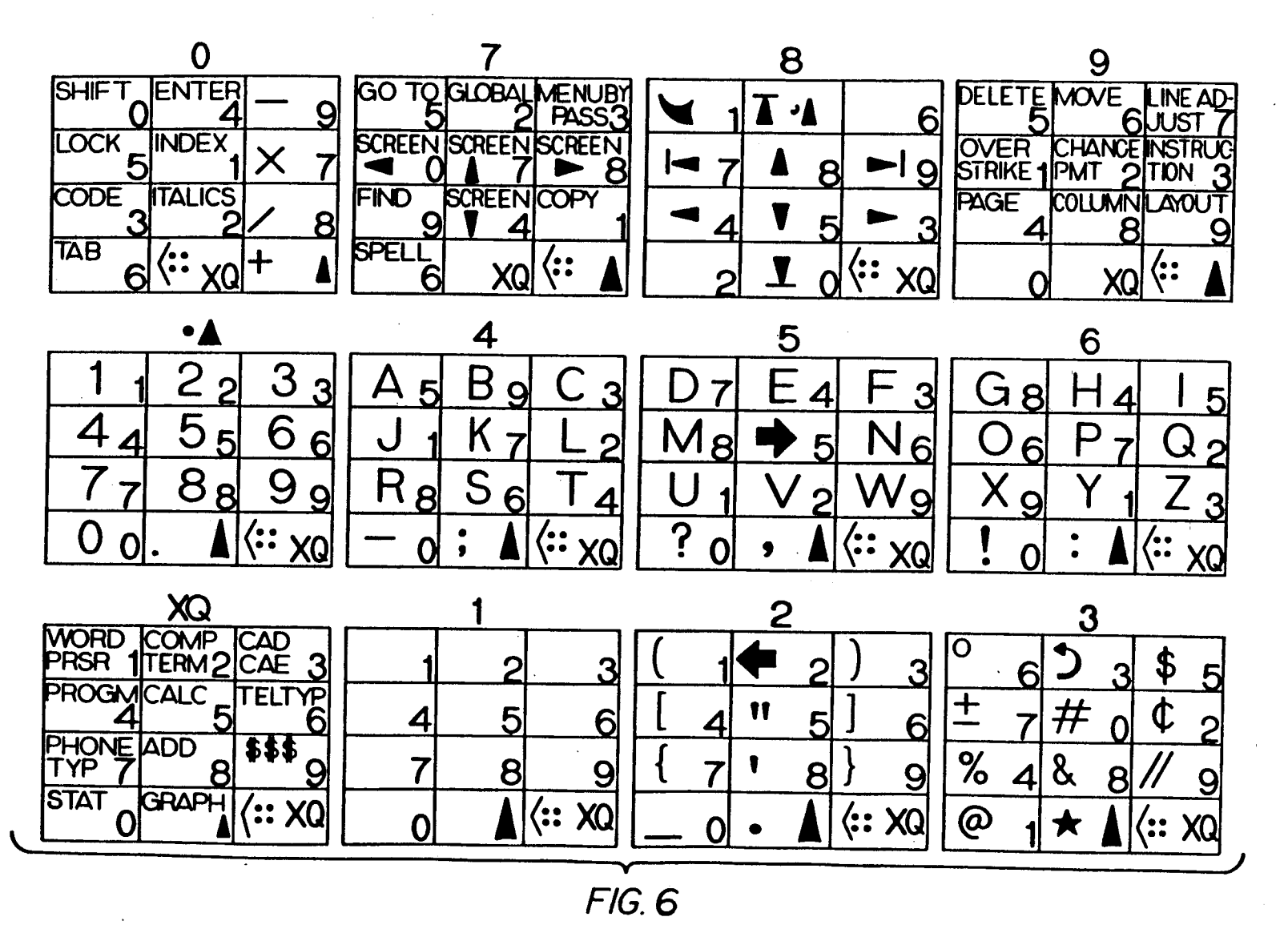

In this mode of operation, which is illustrated by the twelve key embodiment of FIG. 6, wherein the entire alphabet is processed by an initial keystroke on three keys 4,5,6 with three middle fingers of one hand, the following chart outlines the keying difficulty factor, wherein it is a goal to obtain with the least difficult three categories in the order of over 90% of the more frequently used characters. These difficulty charts may be empirically derived from various touch typists using the explicit key combinations and fingers to which this invention is directed. In the following table, the keys are identified by the numerical digit layout as set forth in FIGS. 4 and 6 and thus accounts for the reach factor of the different ones of the three middle fingers on one hand when they are positioned at the 4—5-6 home key row.

| RELATIVE EASE OF SUCCESSIVE KEYSTROKE PAIRS OF SINGLE KEYS | |
| --- | --- |
| Easiest | 4-4, 5-5, 6-6 |
| Very easy | 4-5, 5-1, 5-4, 5-7, 6-1, 6-4, 6-5 |
| Easy | 4-2, 4-6, 4-8, 5-3, 5-6, 6-2, 6-7, 6-8 |
| Harder | 4-3, 4-9, 5-9 |
| Hardest | 4-1, 4-7, 5-2, 5-8, 6-3, 6-9 |

From various tables available showing the relative frequency of use of the alphabet characters per thousand characters, the following from Britannica is representative, and the starred entries are those selected for entry without moving the three stroking fingers away from the set of the three home keys 4,5,6:

| FREQUENCY OF OCCURRENCE OF ALPHABET CHARACTERS | | | | |
| --- | --- | --- | --- | --- |
| *E 130 | *I 74 | C 31 | Y 19 | X 5 |
| *T 92 | S 61 | F 28 | G 16 | Q 3 |
| *N 79 | D 42 | P 27 | W 16 | K 3 |
| *R 76 | L 36 | U 26 | V 15 | J 2 |
| *O 75 | *H 34 | M 25 | B 10 | Z 1 |
| *A 74 | | | | |

A preferred embodiment of the keyboard afforded by this invention for fast data entry with a keyboard requiring two successive strokes of single keys with three fingers resting at the 4,5,6 home position is set forth in FIG. 6.

Note that this provides an important feature of the invention, particularly and peculiarly directed to two stroke per entry type keyboard systems. For the entire alphabet, the first stroke is at the home key position and does not require any movement of the typing finger to another key. That provides the fastest possible mode of entry. Furthermore, the entire alphabet is selected from three rows of keys, labelled with the decimal digits 1 to 9, so that the second stroke in the worst case requires only movement of a stroking finger to an adjacent key.

Furthermore in accordance with the foregoing charts, those alphabetic characters most frequently encountered are chosen by the easiest to enter keystroke sequences. Thus for the characters T,O and the space function, the fingers need not move from the home keys, nor do they have to move other than to provide two successive strokes of the same key, 4,4 or 5,5 or 6,6. Other frequently encountered characters have very easy to use finger sequences, such as E processed by the two keystrokes 5,4. It is a particular advantage to limit the typing strokes to the three middle fingers, since the thumb and little finger tend to be more awkward and take more typing time in reaching away from home keys. Note that 80% of business usage is covered by the characters E,T,A,O,I,N,S,H,R,D,L,U and space, which in the FIG. 6 embodiment are all obtained with the easiest strokes and most from the home key bank 4,5,6.

This invention thus in a two stroke per entry computer keyboard having as few as four keys provides comprehensive and rapid touch typing input from fingers on a single hand. The embodiment of FIGS. 7 and 8 provides similarly for a three stroke per entry mode an entire typewriter keyboard vocabulary with only three keys.

Figures 7, 8:
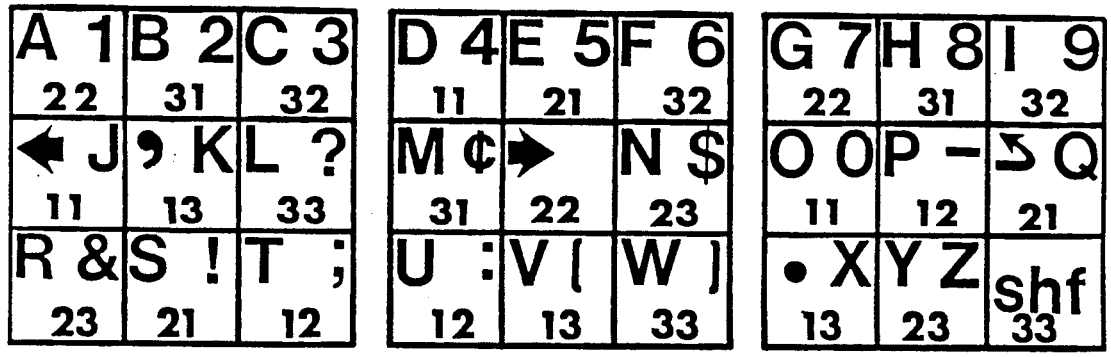
FIG. 7 represents a three key layout for three stroke per entry operation providing the equivalent key entries to a full conventional typewriter keyboard of more than 40 keys.
FIG. 8 is a key selection chart for the keyboard of FIG. 7.

As the table of FIG. 8 shows, A is typed by the three keystroke sequence 1,2,2. Z, however, requires the shift key prefix with the three keystroke sequence 1,3,3. A shift lock key can be provided for reducing strokes in the choice of numerical digits, when typing in number sequences, if desired, such as by use of the shift 2,2,2 code, not used. In this embodiment, as hereinbefore explained, the easier to stroke entries are assigned to the most frequently encountered entries, so that essentially 80% of the entries are provided by a simple sequence of three successive key strokes, where the three typing fingers never need leave the home key position, thereby significantly reducing the typing time.

This invention therefore has provided keyboards with fewer keys than heretofore contemplated for typing and computer systems, and has provided improvements in the entry efficiency and convenience of using keyboards, particularly for rapid one hand touch typing entry of many different input characters or instructions from few keys. Therefore, having advanced the state of the art, those novel features representative of the spirit and nature of the invention are defined with particularity in the following claims.

I claim:

1. The keyboard improvement for a keyboard system requiring two successive keystrokes for making a keyboard entry of a character or function, comprising in combination, a keyboard constituting a set seven side-by-side keys arranged in an array of two rows of three keys for actuation of three fingers and a seventh key overlapping the two rows at one end thereof from which the keystrokes are made operable in a touch typing mode by easy to select finger positioning from the fingers of a single hand resting in a home position on the keyboard, data processing means for processing an entire set of alphanumeric characters individually entered as a sequence of two said keystrokes, and indicia means identifying for each of the keys the sequence of two keys to be stroked for entering said alphanumeric characters.

* * * * *